United States Patent [19]
Hugenholtz

[11] 3,838,354
[45] Sept. 24, 1974

[54] FREQUENCY SYNTHESIZER HAVING THREE CONTROL LOOPS

[75] Inventor: Eduard Herman Hugenholtz, Toronto, Ontario, Canada

[73] Assignee: U.S. Philips Corporation, New York, N.Y.

[22] Filed: July 30, 1973

[21] Appl. No.: 383,896

Related U.S. Application Data

[63] Continuation of Ser. No. 232,119, March 6, 1972, abandoned.

[30] Foreign Application Priority Data

Apr. 23, 1971 Canada ............................... 111140

[52] U.S. Cl. .......................... 331/4, 331/11, 331/22, 331/31

[51] Int. Cl. ............................................ H03b 3/04

[58] Field of Search ............................... 331/10–12, 331/19, 22, 30, 31, 4

[56] References Cited

UNITED STATES PATENTS

| | | | |
|---|---|---|---|
| 2,956,239 | 10/1960 | Hugenholtz et al | 331/11 X |
| 2,964,714 | 12/1960 | Jakubowics | 331/22 X |
| 3,365,676 | 1/1968 | Buss | 331/11 |
| 3,688,212 | 8/1972 | Hugenholtz | 331/4 |

*Primary Examiner*—Herman Karl Saalbach
*Assistant Examiner*—Siegfried H. Grimm
*Attorney, Agent, or Firm*—Frank R. Trifari; Henry I. Steckler

[57] ABSTRACT

A frequency synthesizer has a voltage-controlled oscillator whose output frequency is locked with the aid of a first control loop in relationship to a harmonic of the output signal from a first reference pulse generator. A second reference pulse generator is part of a second control loop which stabilizes the frequencies of the output signals from said first and second reference pulse generators with respect to each other on an adjustable constant difference frequency. A third control loop disturbs the locking of the oscillator when it is locked to a frequency which is not a harmonic of the output signal from said second reference pulse generator.

8 Claims, 2 Drawing Figures

FREQUENCY SYNTHESIZER HAVING THREE CONTROL LOOPS

Figures 1, 2:
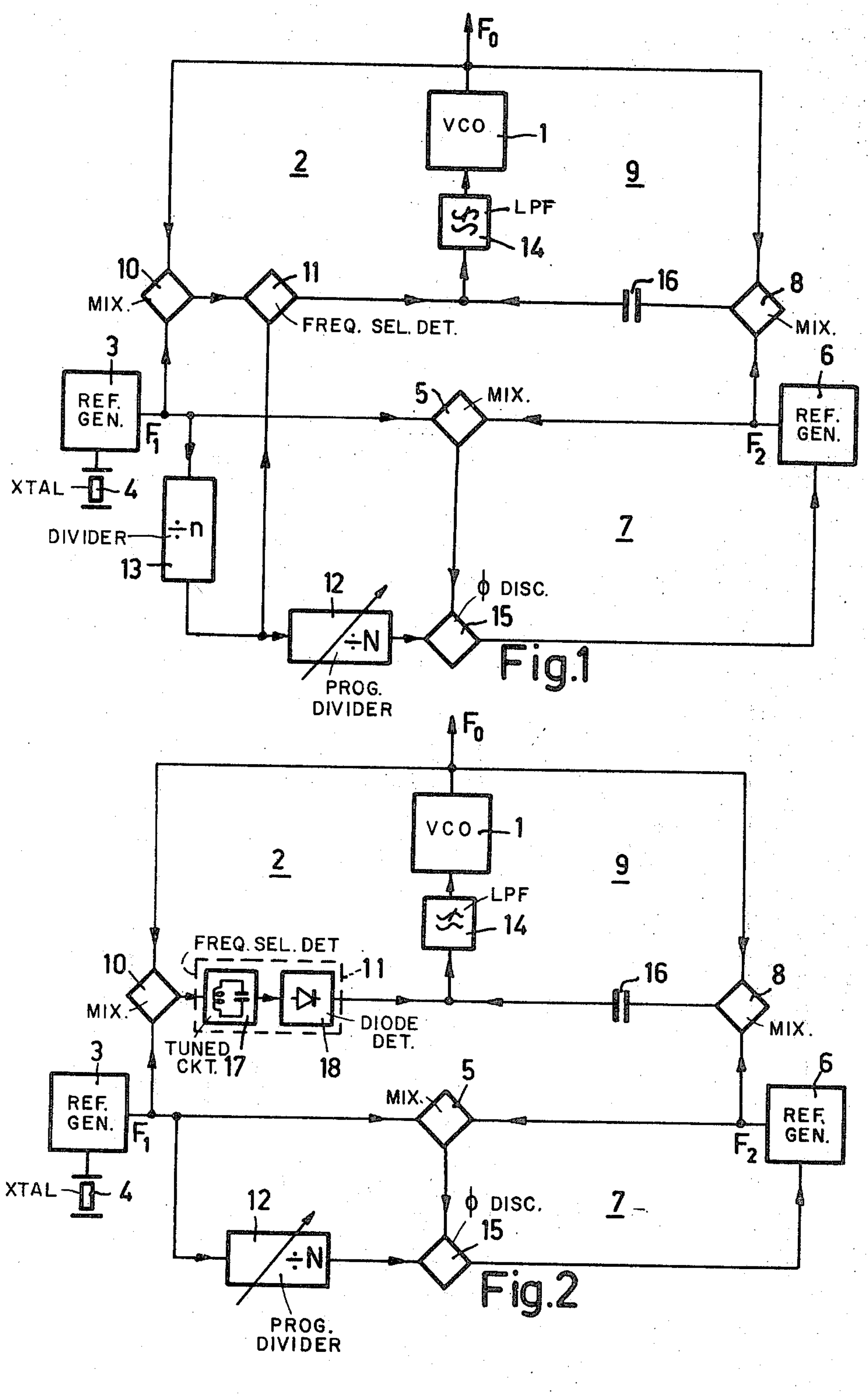

This is a continuation, of application Ser. No. 232,119, filed Mar. 6, 1972 now abandon.

The invention relates to a frequency synthesizer including a voltage-controlled oscillator whose output frequency is locked with the aid of a (first) control loop in relationship to a harmonic of the output signal from a (first) reference pulse generator.

In the known frequency synthesizers of the type mentioned above it is possible to look to different harmonies of the reference pulse generator. However, difficulties occur when the oscillator frequency is to be locked to a given desired harmonic, particularly when the fundamental frequency of the output signal from the reference pulse generator is low as compared with the frequency of the harmonic to which locking is to be effected.

In order to lock the output frequency of the voltage-controlled oscillator in an unambiguous manner to a given desired harmonic of the output signal from the reference pulse generator it has been proposed in prior U.S. Pat. No. 3,688,212 to provide the frequency synthesizer with a second reference pulse generator and a second control loop by which the frequencies of the output signals from said first and second reference pulse generators are stabilised with respect to each other to an adjustable constant difference, and with a third control loop by which locking of the oscillator is disturbed when it is locked to a frequency which is not a harmonic of the output signal from said second reference pulse generator.

An object of the present invention is to provide a frequency synthesize provided with two reference pulse generators and three control loops in which the oscillator output frequency can be locked to a given desired harmonic of the output signal from the first reference pulse generator minus (or pulus) a given frequency. According to the invention the first control loop is to this end provided with a first pulse mixer to which the oscillator output signal and the output signal from said first reference pulse generator are applied, and a frequency-selective detector connected to the output of said first pulse mixer, the output signal from said frequency-selective detector being applied to the oscillator to lock said oscillator to a frequency which is equal to a harmonic of the output signal from said first reference pulse generator minus (or plus) a desired frequency shift brought about by said frequency-selective detector, said second control loop being furthermore provided with a programmed divider with the aid of which said second reference pulse generator can be adjusted in such a manner that its output signal has a higher harmonic which corresponds to the frequency-shifted output frequency of the oscillator.

In order that the invention may be readily carried into effect, some embodiments thereof will now be described in detail by way of example with reference to the accompanying diagrammatic drawings in which:

FIG. 1 shows a first possible embodiment of the frequency synthesizer according to the invention, FIG. 2 shows a further possible embodiment.

In FIG. 1 the reference numeral 1 denotes a voltage-controlled oscillator whose output frequency $F_0$ is locked with the aid of a first control loop 2 in relationship to a harmonic of the output signal from a first reference pulse generator 3. The fundamental frequency F1 of the output signal from reference pulse generator 3 is stabilised by means of a crystal 4. The output signal from reference pulse generator 3 is applied to a pulse mixer 5 to which also the output signal from a second reference pulse generator 6 is applied, said pulse mixer forming part of a second control loop 7 with the aid of which the frequencies of the output signals from the first and second reference pulse generators are stabilised with respect to each other on an adjustable constant difference. The output signal of fundamental frequency $F_2$ derived from the second reference pulse generator 6 and the output signal $F_0$ from oscillator 1 are applied to a pulse mixer 8 which forms part of a third control loop 9 by which locking of the oscillator 1 is disturbed when it is locked to a harmonic of the output signal $F_1$ from reference pulse generator 3 which is not a harmonic of the output signal $F_2$ from said second reference pulse generator 6.

According to the invention the oscillator output frequency can be locked to a frequency which deviates from a harmonic of the fundamental frequency $F_1$ of said first frequency pulse generator 3 if said first control loop 2 is provided with a first pulse mixer 10 to which the oscillator output signal $F_0$ and the output signal $F_1$ from said first reference pulse generator 3 are applied, and a frequency selective detector 11 connected to the output of said first pulse mixer 10, the output signal from said frequency selective detector being applied to the oscillator to lock said oscillator to a frequency which is equal to a harmonic of the output signal from said first reference pulse generator 3 minus (or plus) a frequency shift $\Delta f$ brought about by said frequency selective detector 11, said second control loop 7 being provided with a programmed divider 12 by which said second reference pulse generator 6 can be adjusted in a manner such that its output signal has a higher harmonic which corresponds to the frequency-shifted output frequency of said oscillator.

In the embodiment shown in FIG. 1 the said frequency selective detector 11 is constituted by a phase discriminator to which the output signal from pulse mixer 10 is applied at one end and a reference signal having a frequency $f_a$ representing the desired frequency shift $\Delta f$ is applied at the other end. Said reference signal $f_a$ is derived from a fixed divider 13 connected to the first reference pulse generator 3. The output signal from phase discriminator 11 is applied through a lowpass filter 14 to a control member (not shown) of the voltage-controlled oscillator 1 and causes the oscillator output frequency to be locked to the desired frequency $F_0 = KF_1 + f_a$. This desired locking is, however possible only if the frequency of the output signal $F_2$ from said second reference pulse generator 6 has a higher harmonic which corresponds to the desired frequency $F_0 = KF_1 + f_a$. The correct fundamental frequency $F_2$ of said second reference pulse generator 6 may be obtained in a simple manner by correct adjustment of the mutual constant frequency difference between the output frequencies of the two reference pulse generators 3 and 6. To this end the second control loop 7 comprises a phase discriminator 15 to which the output signal of frequency $(F_2 - F_1)$ derived from pulse mixer 5 is applied at one end and to which a signal obtained by frequency division of the output signal $F_1$ from reference pulse generator 3 is applied as the reference signal at the other end. In the embodiment shown the last-mentioned reference signal is obtained by dividing the output signal of frequency $f_a = F_1/n$ derived from the fixed divider 13 with a division factor of $n$ with the aid of said programmed divider 12 having a division factor of $N_F$ so as to obtain a reference signal having a frequency $F_1/nN$. Based on this reference signal the second control loop causes the frequency $F_2$ of reference pulse generator 6 to be adjusted to such a value that: $F_2 - F_1 = F_1/n \cdot N$. It follows that $n \cdot N \cdot F_2 = (n \cdot N + 1) \cdot F_1$.

Thus the frequency $F_2$ is locked with respect to the frequency $F_1$ and this frequency $F_2$ can be adjusted by adjusting the division factor N of programmed divider 12.

When the oscillator frequency $F_0 = KF_1 + f_a$ is not equal to a given harmonic of the frequency $F_2$ of reference pulse generator 6, pulse mixer 8 supplies an alternating output voltage which is applied through a capacitor 16 to the control member (not shown) of the voltage-controlled oscillator 1. As long as this alternating voltage is applied to the voltage-controlled oscillator 1, it cannot lock to a given frequency. Oscillator 1 is thus controlled to lock on a frequency which is equal to the desired harmonic of the reference frequency $F_1$ plus a desired frequency shift $f_a$.

In the embodiment shown in FIG. 2 the parts corresponding to those in FIG. 1 have the same reference numerals. As this Figure shows, this embodiment largely corresponds to that of FIG. 1. It is, however, distinguished in that the frequency selective detector 11 incorporated in the first control loop 2 is constituted by a tuned circuit 17 connected to the output of the pulse mixer 10, the output of said tuned circuit being constituted by a diode detector 18. This circuit is tuned to a frequency $f_b$ corresponding to the desired frequency shift. The output signal from diode detector 18 is applied through said lowpass filter 14 to the control member (not shown) of the voltage-controlled oscillator 1 and causes the oscillator to be tuned to a frequency $F_0 = KF_1 + f_b$. Locking is established when this frequency is also equal to a harmonic of the reference frequency $F_2$ which occurs at the output of the second reference pulse generator 6. Here too, the correct frequency $F_2$ is adjusted with the aid of a programmed divider 12.

In order to render it possible to make a choice from a plurality of shift frequencies, the fixed divider 13 of FIG. 1 may also be programmed so that it may optionally supply for example, one out of two possible fixed shift frequencies $f_a$ and $f_b$. A further possibility in the embodiment of FIG. 1 is to connect a frequency-selective detector of the kind as used in the embodiment of FIG. 2 to the output of pulse mixer 8 in addition to the frequency selective detector 11 present in this embodiment as a phase discriminator, while the output of one of these frequency selective detectors may be optionally connected with the aid of a switch to the voltage-controlled oscillator through the filter 14.

What is claimed is:

1. A circuit comprising a first reference pulse generator having an output; a voltage controlled oscillator having a frequency control input and an output; a first control loop means for locking the output frequency of said oscillator into a selected relationship with a harmonic of the output frequency of said first generator comprising a first mixer having first and second inputs coupled to said oscillator and first generator outputs respectively, and an output, a frequency selective detector means for locking the oscillator frequency onto a frequency differing from a harmonic of said first generator frequency by a given shift frequency having a first input coupled to said first mixer output and an output coupled to said oscillator frequency control input; a second reference pulse generator having a frequency control input and an output; a second control loop means including said second generator for locking the output frequencies of said first and second generators to selectable constant difference frequencies with respect to each other, said second loop further comprising a programmable frequency divider having an input coupled to said first generator output and an output, control signal generating means coupled to said divider output and to said second generator control input; and a third control loop means having two inputs coupled to said oscillator and said second generator outputs respectively, and an output means coupled to said oscillator control input for ensuring that the oscillator frequency is locked onto a harmonic of the frequency of said second generator.

2. A circuit as claimed in claim 1 wherein said detector means comprises a phase discriminator having a second input, and further comprising means coupled between said first generator output and discriminator second input for applying to said discriminator a reference signal derived from said first generator frequency and having a frequency equal to said shift frequency

3. A circuit as claimed in claim 2 wherein said applying means comprises a fixed frequency divider.

4. A circuit as claimed in claim 2 wherein said applying means comprises a programmable frequency divider.

5. A circuit as claimed in claim 1 wherein said detector means comprises a tuned circuit tuned to said shift frequency coupled to said first mixer output, and a diode detector coupled between said tuned circuit and said oscillator control input.

6. A circuit as claimed in claim 1 wherein said second control loop comprises a second mixer having a pair of inputs coupled to said first and second generator outputs respectively. and an output; and said control signal generating means comprises a phase discriminator having a pair of inputs coupled to said second mixer output and said divider output respectively, and an output coupled to said second generator control input; whereby the division factor of said divider controls the second generator output frequency.

7. A circuit as claimed in claim 1 wherein said third control loop means further comprises a second mixer having a pair of inputs coupled to said second generator and said oscillator outputs respectively, and an output coupled to said oscillator control input.

8. A circuit as claimed in claim 7 further comprising a capacitor coupled between said oscillator control input and said second mixer output.

* * * * *